(12) United States Patent
Cheng et al.

(10) Patent No.: US 9,269,547 B2
(45) Date of Patent: Feb. 23, 2016

(54) SEMICONDUCTOR EQUIPMENT

(75) Inventors: Jui-Sheng Cheng, Tainan (TW);
Tsung-Hsun Han, Kaohsiung (TW);
Tsan-Hua Huang, Tainan (TW)

(73) Assignee: Hermes-Epitek Corporation, Taipei (TW)

(*) Notice: Subject to any disclaimer, the term of this patent is extended or adjusted under 35 U.S.C. 154(b) by 844 days.

(21) Appl. No.: 13/474,017

(22) Filed: May 17, 2012

(65) Prior Publication Data
US 2012/0304922 A1 Dec. 6, 2012

(30) Foreign Application Priority Data
Jun. 3, 2011 (TW) .............................. 100119661 A

(51) Int. Cl.
| | | |
|---|---|---|
| H01J 37/32 | (2006.01) | |
| C23C 16/44 | (2006.01) | |
| H01L 21/687 | (2006.01) | |
| H01L 21/67 | (2006.01) | |

(52) U.S. Cl.
CPC ......... H01J 37/3288 (2013.01); C23C 16/4401 (2013.01); C23C 16/4411 (2013.01); H01J 37/32449 (2013.01); H01J 37/32513 (2013.01); H01J 37/32853 (2013.01); H01J 37/32871 (2013.01); H01L 21/67017 (2013.01); H01L 21/6719 (2013.01); H01L 21/68742 (2013.01)

(58) Field of Classification Search
CPC ............ H01J 37/3288; H01J 37/32853; H01J 37/32871; H01J 37/32513; H01J 37/32449; H01L 21/6719; H01L 21/68742; H01L 21/67017; C23C 16/4401; C23C 16/4411
USPC .......................................................... 118/715
See application file for complete search history.

(56) References Cited

U.S. PATENT DOCUMENTS

| | | | | |
|---|---|---|---|---|
| 6,174,377 | B1 * | 1/2001 | Doering et al. | 118/729 |
| 6,387,185 | B2 * | 5/2002 | Doering et al. | 118/729 |
| 6,800,173 | B2 * | 10/2004 | Chiang et al. | 156/345.33 |
| 7,276,124 | B2 | 10/2007 | Gurary et al. | |
| 8,454,749 | B2 * | 6/2013 | Li | 118/715 |
| 8,597,462 | B2 * | 12/2013 | Brown et al. | 156/345.37 |
| 8,906,160 | B2 * | 12/2014 | Endo et al. | 118/715 |
| 2007/0051312 | A1 * | 3/2007 | Sneh | 118/719 |
| 2012/0304922 | A1 * | 12/2012 | Cheng et al. | 118/70 |

* cited by examiner

Primary Examiner — Jeffrie R Lund
(74) Attorney, Agent, or Firm — Donald E. Stout; Stout, Uxa & Buyan, LLP

(57) ABSTRACT

Semiconductor equipment is disclosed in this invention. The semiconductor equipment includes a reaction chamber, a wafer susceptor, and a liner device. The reaction chamber includes an opening and a circular inner wall. The wafer susceptor is capable of carrying at least one wafer. The liner device is disposed between the wafer susceptor and the circular inner wall of the reaction chamber. The liner device is capable of moving vertically between a first position and a second position. The liner device includes at least one venting opening, wherein the venting opening is connected with a venting device. Particles which are accumulated within the liner device can be removed by the venting device.

9 Claims, 3 Drawing Sheets

SEMICONDUCTOR EQUIPMENT

CROSS-REFERENCE TO RELATED APPLICATIONS

The entire contents of Taiwan Patent Application No. 100119661, filed on Jun. 3, 2011, from which this application claims priority, are incorporated herein by reference.

BACKGROUND OF THE INVENTION

1. Field of the Invention

The present invention generally relates to semiconductor equipment, and more particularly to semiconductor equipment having cleaning function.

2. Description of Related Art

Semiconductor manufacturing equipment are commonly used in the production of semiconductor components. The semiconductor manufacturing equipment typically has a reaction chamber. The reaction gases required by the semiconductor manufacturing process can be provided into the reaction chamber by the showerhead of the reaction chamber. After several times of semiconductor manufacturing processes, particles or contaminants may be accumulated within the reaction chamber. Thus, process results and the process yields are affected by the residues.

Generally speaking, the particles or contaminants accumulated within the reaction chamber can be removed manually when the reaction chamber is opened; however, this usually leads to negative results, such as long maintenance times, unstable process results, and so on.

For the reasons that there are some disadvantages of the prior art mentioned above, there exists a need to propose a semiconductor equipment having cleaning function. The particles or contaminants accumulated within the reaction chamber can be timely removed so as to avoid excessive accumulation.

SUMMARY OF THE INVENTION

Accordingly, the present invention has been made in order to meet such a need described above, and it is an object of the present invention to provide a semiconductor equipment having cleaning function. The particles or contaminants accumulated within the reaction chamber can be timely removed so as to avoid excessive accumulation.

In order to achieve the above object, the present invention provides semiconductor equipment which includes a reaction chamber, a wafer susceptor, and a liner device. The reaction chamber includes an opening and a circular inner wall. The wafer susceptor is capable of carrying at least one wafer. The liner device is disposed between the wafer susceptor and the circular inner wall of the reaction chamber. The liner device is capable of moving vertically between a first position and a second position. The liner device includes at least one venting opening, wherein the venting opening is connected with a venting device. Particles which are accumulated within the liner device can be removed, by the venting device.

The semiconductor equipment of the present invention is capable of timely removing the particles accumulated within the liner device by the venting device. The venting device is capable of removing the particles within the liner device without opening the reaction chamber. Thus, the excessive accumulation of the particles within the reaction chamber can be avoided. Moreover, the maintenance time is decreased, and the process result is improved.

DETAILED DESCRIPTION OF THE INVENTION

The detailed description of the present invention will be discussed in the following embodiments, which are not intended to limit the scope of the present invention and can be adapted for other applications. While drawings are illustrated in detail, it is appreciated that the quantity of the disclosed components may be greater or less than that disclosed, except when expressly restricting the amount of the components.

Figure 1:
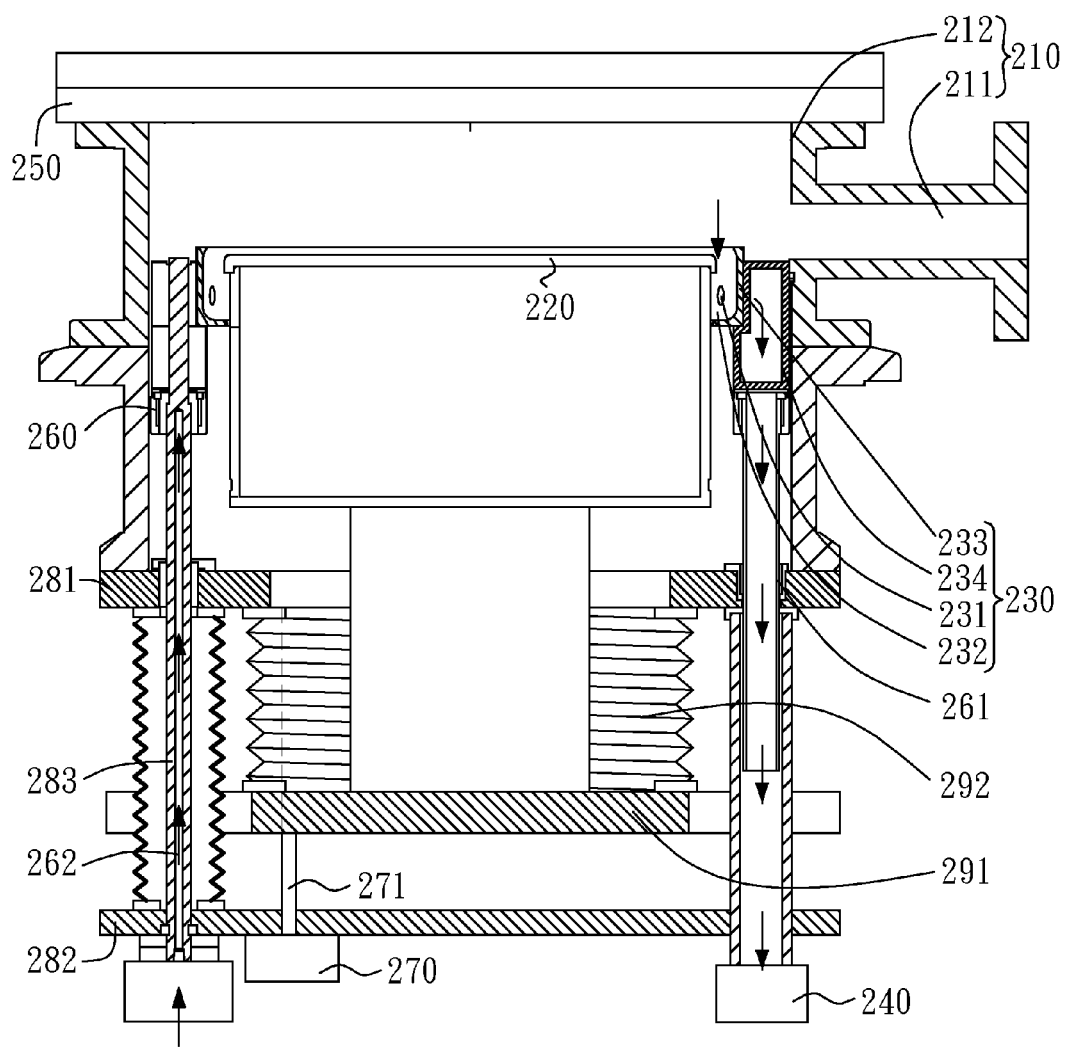
FIG. 1 shows a side view of the semiconductor equipment in accordance with a preferred embodiment of the present invention.

FIG. 1 shows a side view of the semiconductor equipment 200 in accordance with a preferred embodiment of the present invention. The semiconductor equipment 200 includes a reaction chamber 210, a wafer susceptor 220, a showerhead 250, and a liner device 230.

The wafer susceptor 220 is disposed within the reaction chamber 210, and the wafer susceptor 220 is capable of carrying at least one wafer. The showerhead 250 is disposed over the wafer susceptor 220. The reaction gases required by the semiconductor manufacturing process can be provided into the reaction chamber 210 by the showerhead 250. In this embodiment, the reaction chamber 210 includes an opening 211 and a circular inner wall 212. The wafer can be transferred to the wafer susceptor 220 through the opening 211 of the reaction chamber 210. The circular inner wall 212 is capable of making the reaction gases required by the semiconductor manufacturing process flow steadily and distribute uniformly within the reaction chamber 210.

Figure 2:
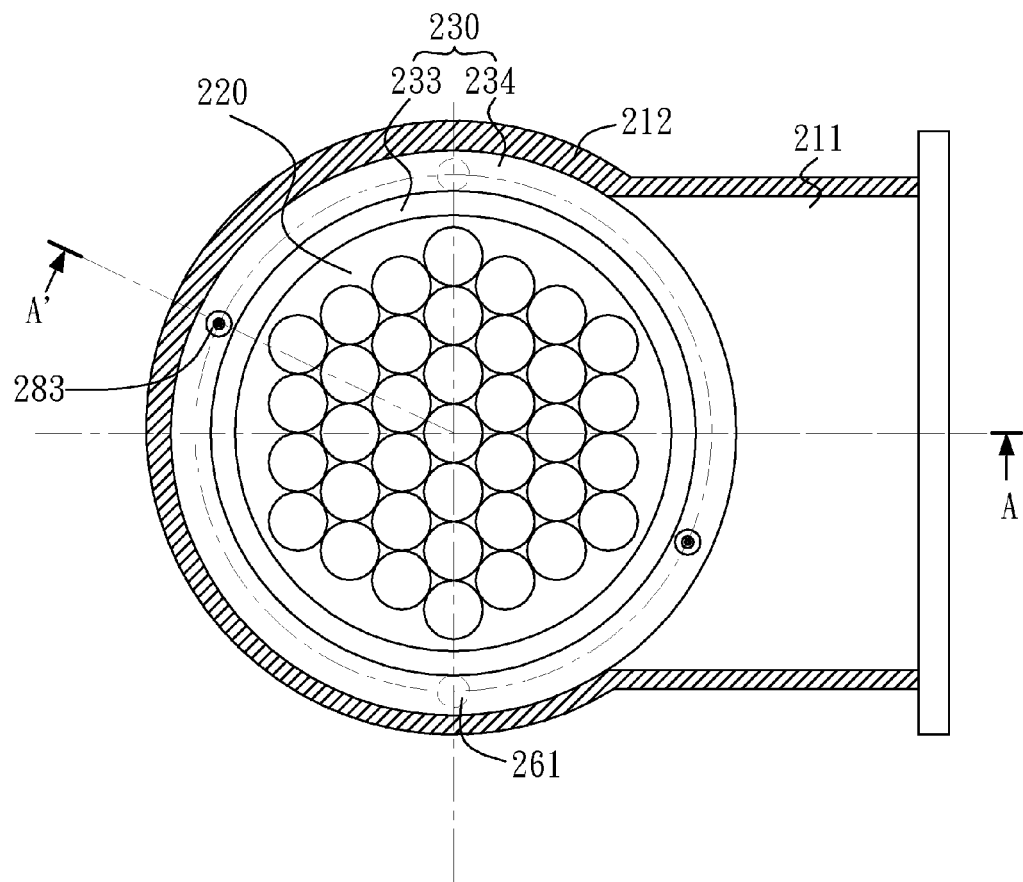
FIG. 2 shows the top sectional view of the reaction chamber shown in FIG. 1.

FIG. 2 shows the top sectional view of the reaction chamber 210 shown in FIG. 1, wherein FIG. 1 is the sectional view along the cutting-plane line A-A' of FIG. 2. Referring to FIG. 1 and FIG. 2, the liner device 230 is disposed between the wafer susceptor 220 and the circular inner wall 212 of the reaction chamber 210. The liner device 230 includes at least one venting opening 231, which is connected with a venting device 240. Particles which are accumulated within the liner device 230 can be removed by the venting device 240.

According to this embodiment, the liner device 230 has a circular groove 232. The circular groove 232 is lower than the wafer susceptor 220. Particles can be accumulated within the circular groove 232 without affecting the wafer. The venting opening 231 is disposed within the circular groove 232, particles which are accumulated within the circular groove 232 can be removed by the venting device 240.

In this embodiment, the semiconductor equipment 200 can further include a movable table 260, a first frame 281, a second frame 282, at least one supporting rod 283, and a driving device 270.

According to this embodiment, the reaction chamber 210 is fixed on the first frame 281. The supporting rod 283 is fixed on the second frame 282, and one end of the supporting rod 283 is fixed on the movable table 260. The driving device 270 is disposed on the second frame 282, wherein an expandable portion 271 of the driving device 270 is connected with the first frame 281. By the design mentioned above, the driving device 270 is capable of making the movable table 260 move vertically. In this embodiment, the driving device 270 is an electric cylinder, but is not limited to this. The driving device 270 can be a pneumatic cylinder, an oil cylinder, or other linear driving device. Moreover, the semiconductor equipment 200 can further include a third frame 291 and a flexible catheter 292. The wafer susceptor 220 is disposed on the third frame 291. When the third frame 291 moves vertically, the wafer susceptor 220 also moves vertically. The flexible catheter 292 is disposed between the third frame 291 and the first frame 281. The flexible catheter 292 is used for preventing the gases within the reaction chamber 210 from leaking to the outside of the reaction chamber 210.

According to this embodiment, the liner device 230 is disposed on the movable table 260. The movable table 260 includes at least one venting tube 261. Particles can be transferred to the venting device 240 through the venting tube 261. Moreover, the venting tube 261 has a proper length. Thus, the reaction chamber 210 will not be affected by the particles again because the distance between the exit of the venting tube 261 and the reaction chamber 210 is not enough.

According to this embodiment, the movable table 260 can further include at least one cooling tube 262, cooling fluid passes through the cooling tube 262 for controlling the temperature of the movable table 260. In this embodiment, the cooling tube 262 is disposed within the supporting rod 283 so as to save the space, but is not limited to this. The movable table 260 can exclude the cooling tube 262. Or the cooling tube 262 can be disposed at other proper position.

Figure 3:
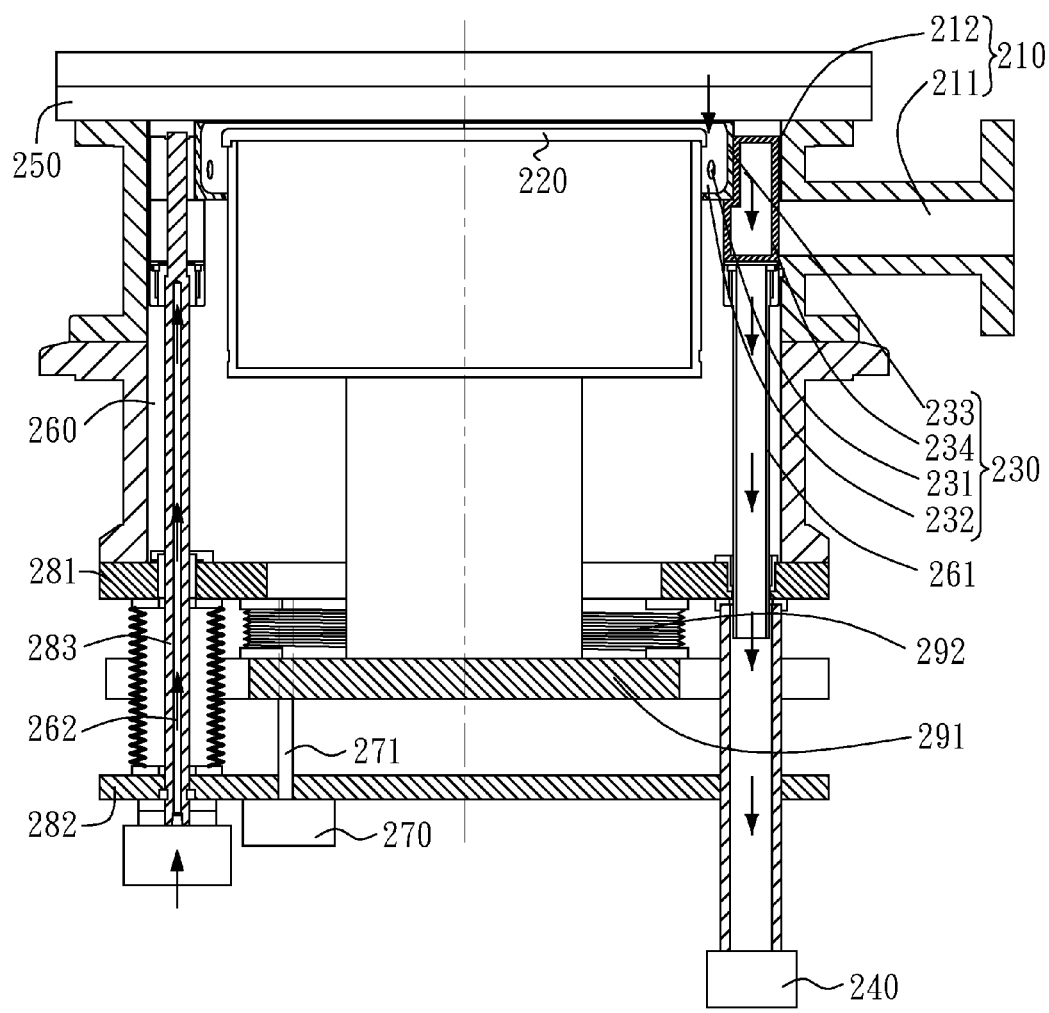
FIG. 3 shows the operation method of the semiconductor equipment shown in FIG. 1.

FIG. 3 shows the operation method of the semiconductor equipment 200 shown in FIG. 1. Referring to FIG. 1 and FIG. 3, the liner device 230 is capable of moving vertically between a first position and a second position. As shown in FIG. 1, when the liner device 230 moves vertically to the second position, the wafer can be transferred to the wafer susceptor 220 through the opening 211 of the reaction chamber 210. As shown in FIG. 3, when the liner device 230 moves vertically to the first position, the liner device 230 is capable of sealing the opening 211 of the reaction chamber 210 so as to prevent the air flow within the reaction chamber 210 from being affected by the opening 211. In this embodiment, the liner device 230 forms the flow space of the reaction gases required by the semiconductor manufacturing process, wherein the liner device 230 contacts the showerhead 250. But not limited to this, in other embodiment, the liner device 230 does not contact the showerhead 250.

Referring to FIG. 2 and FIG. 3, according to this embodiment, the liner device 230 includes an inner liner 233 and an outer liner 234. When the liner device 230 moves vertically to the first position, the inner liner 233 surrounds the wafer susceptor 220 and forms the flow space of the reaction gases required by the semiconductor manufacturing process. The inner liner 233 contacts the showerhead 250. In this time, the outer liner 234 is capable of sealing the opening 211 of the reaction chamber 210 so as to prevent the air flow within the reaction chamber 210 from being affected by the opening 211. Because the inner liner 233 surrounds the wafer susceptor 220 and forms the flow space of the reaction gases required by the semiconductor manufacturing process, particles will be accumulated within the inner liner 233. When performing maintenance, only the inner liner 233 needs to be removed and cleaned. It is not necessary for the outer liner 234 to be removed and cleaned every time.

The semiconductor equipment 200 of the present invention is capable of timely removing the particles accumulated within the liner device 230 by the venting device 240. The venting device 240 is capable of removing the particles within the liner device 230 without opening the reaction chamber 210. Thus, the excessive accumulation of the particles within the reaction chamber 210 can be avoided. Moreover, the maintenance time is decreased, and the process result is improved.

Although specific embodiments have been illustrated and described, it will be appreciated by those skilled in the art that various modifications may be made without departing from the scope of the present invention, which is intended to be limited solely by the appended claims.

What is claimed is:

1. A semiconductor equipment, comprising:
a reaction chamber, said reaction chamber having an opening and a circular inner wall;
a wafer susceptor, said wafer susceptor being capable of carrying at least one wafer;
a liner device, said liner device being disposed between said wafer susceptor and said circular inner wall of said reaction chamber, said liner device being capable of moving vertically between a first position and a second position, said liner device having an outer liner and at least one venting opening, said venting opening being connected with a venting device, wherein particles which are accumulated within said liner device can be removed by said venting device; and
a movable table, wherein said liner device is disposed on said movable table and wherein said movable table further comprises at least one venting tube, said particles are transferred to said venting device through said venting tube, and wherein said venting tube connects said outer liner and said venting device.

2. The semiconductor equipment according to claim 1, wherein said liner device further comprises a circular groove, said venting opening is disposed within said circular groove, said particles which are accumulated within said circular groove can be removed by said venting device.

3. The semiconductor equipment according to claim 1, wherein when said liner device moves vertically to said first position, said liner device is capable of sealing said opening of said reaction chamber.

4. The semiconductor equipment according to claim 1, further comprising a showerhead, wherein said showerhead is disposed over said wafer susceptor, when said liner device moves vertically to said first position, said liner device contacts said showerhead.

5. The semiconductor equipment according to claim 1, wherein said liner device further comprises an inner liner, when said liner device moves vertically to said first position, said inner liner surrounds said wafer susceptor, said outer liner is capable of sealing said opening of said reaction chamber.

6. The semiconductor equipment according to claim 1, wherein said movable table further comprises at least one cooling tube, cooling fluid passes through said cooling tube for controlling the temperature of said movable table.

7. The semiconductor equipment according to claim 1, and further comprising a driving device, wherein said driving device is capable of making said movable table move vertically.

8. The semiconductor equipment according to claim 7, wherein said driving device comprises a pneumatic cylinder, an oil cylinder, or an electric cylinder.

9. The semiconductor equipment according to claim 7, further comprising a first frame, a second frame, and at least one supporting rod, wherein said reaction chamber is fixed on said first frame, said supporting rod is fixed on said second frame, one end of said supporting rod is fixed on said movable table, said driving device is disposed on said second frame, an expandable portion of said driving device is connected with said first frame.

* * * * *